US008332697B1

(12) United States Patent
Peattie

(10) Patent No.: US 8,332,697 B1
(45) Date of Patent: Dec. 11, 2012

(54) METHOD AND APPARATUS FOR TRIGGERING AND CAPTURING DIGITAL CIRCUIT SIGNALS

(75) Inventor: Michael E. Peattie, Campbell, CA (US)

(73) Assignee: Xilinx, Inc., San Jose, CA (US)

( * ) Notice: Subject to any disclaimer, the term of this patent is extended or adjusted under 35 U.S.C. 154(b) by 283 days.

(21) Appl. No.: 12/839,880

(22) Filed: Jul. 20, 2010

(51) Int. Cl.
*G06F 11/00* (2006.01)

(52) U.S. Cl. ........................................ 714/724; 714/734

(58) Field of Classification Search .......... 714/724–727, 714/718–720, 734–735
See application file for complete search history.

(56) References Cited

U.S. PATENT DOCUMENTS

| 5,031,128 | A | * | 7/1991 | Boutigny et al. | 708/212 |
| 5,900,014 | A | * | 5/1999 | Bennett | 711/138 |
| 7,944,234 | B2 | * | 5/2011 | Lunzer et al. | 326/38 |
| 2006/0170452 | A1 | * | 8/2006 | Benavides et al. | 326/37 |

OTHER PUBLICATIONS

Kafig, Bill, *ChipScope Pro—Concepts and Techniques, Course Introduction*, 6 slides from a ChipScope Pro class presented Nov. 2, 2009 at Xilinx, Inc., San Jose, California, USA.
Kafig, Bill, *How ChipScope Pro Works*, 32 slides from a ChipScope Pro class presented Nov. 2, 2009 at Xilinx, Inc., San Jose, California, USA.
Kafig, Bill, *The Inserter Flows*, 29 slides from a ChipScope Pro class presented Nov. 2, 2009 at Xilinx, Inc., San Jose, California, USA.
Kafig, Bill, *Instantiating the Cores, The Core Generator Flow*, 19 slides from a ChipScope Pro class presented Nov. 2, 2009 at Xilinx, Inc., San Jose, California, USA.
Kafig, Bill, *Triggering and Storage*, 32 slides from a ChipScope Pro class presented Nov. 2, 2009 at Xilinx, Inc., San Jose, California, USA.
Kafig, Bill, *Visualizing Data, The ChipScope Pro Analyzer Tool*, 32 slides from a ChipScope Pro class presented Nov. 2, 2009 at Xilinx, Inc., San Jose, California, USA.
Kafig, Bill, *Day 1 Summary*, 6 slides from a ChipScope Pro class presented Nov. 2, 2009 at Xilinx, Inc., San Jose, California, USA.
Kafig, Bill, *Tips 'n' Tricks*, 31 slides from a ChipScope Pro class presented Nov. 2, 2009 at Xilinx, Inc., San Jose, California, USA.
Kafig, Bill, *Time for Timing*, 35 slides from a ChipScope Pro class presented Nov. 2, 2009 at Xilinx, Inc., San Jose, California, USA.
Kafig, Bill, *Case Studies*, 6 slides from a ChipScope Pro class presented Nov. 2, 2009 at Xilinx, Inc., San Jose, California, USA.
Kafig, Bill, *Scripting*, 19 slides from a ChipScope Pro class presented Nov. 2, 2009 at Xilinx, Inc., San Jose, California, USA.
Kafig, Bill, *Remote Debug, Minimizing Your Design Time with the ChipScope Pro Debug and Verification Tools*, 15 slides from a ChipScope Pro Class presented Nov. 2, 2009 at Xilinx, Inc., San Jose, California, USA.

* cited by examiner

*Primary Examiner* — Dieu-Minh Le
(74) *Attorney, Agent, or Firm* — Kin-Wah Tong

(57) ABSTRACT

In one embodiment, a method and apparatus for triggering and capturing digital circuit signals are disclosed. For example, a logic analyzer according to one embodiment includes at least one trigger combination block and a state machine deploy in a memory coupled to the trigger combination block, where the state machine includes an input coupled to an output of the trigger combination block and an output coupled to a capture memory in which one or more digital circuit signals are stored.

20 Claims, 3 Drawing Sheets

METHOD AND APPARATUS FOR TRIGGERING AND CAPTURING DIGITAL CIRCUIT SIGNALS

FIELD OF THE INVENTION

This invention relates generally to digital circuits and relates more particularly to the trigger and capture of data by integrated logic analyzers.

BACKGROUND

A logic analyzer captures and stores signals of a digital circuit, thereby enabling precise observation of the circuit operation. Specifically, a user sets up a trigger event and a capture scheme. A trigger event is a logical or sequential condition of signal events coming from the digital circuit. For example, a logical trigger might be "(A and B)==1," while a sequential trigger might be "A==1 then B===1 then C==1."

A capture scheme dictates how the signals are stored in the capture memory relative to the trigger event. For example, the capture scheme might dictate that the logic analyzer wait for the trigger event, store the signals relating to the trigger event, and then continue to store signals until the capture memory is full. Thus, the logic analyzer fills a finite amount of memory with data (signals) that the user wants.

In conventional integrated logic analyzers (ILAs), which are embedded in the logic fabric of the digital circuit, the trigger and capture functionalities are implemented independently of each other using programmable combinatorial logic. The exact number and character of each of the logic elements dictate how and when the ILA core stores data to be later uploaded and displayed to a user. This approach suffices for simple trigger and capture schemes, but does not support the more complex schemes that may be necessary in order to fully observe the operation of complex digital circuit designs. Support for such complex schemes would likely require additional custom combinatorial logic, as well as new software to support the programming of the custom combinatorial logic.

SUMMARY

In one embodiment, a method and apparatus for triggering and capturing digital circuit signals are disclosed. For example, a logic analyzer according to one embodiment includes at least one trigger combination block and a state machine deploy in a memory coupled to the trigger combination block, where the state machine includes an input coupled to an output of the trigger combination block and an output coupled to a capture memory in which one or more digital circuit signals are stored.

In some embodiments, the logic analyzer can be integrated into the digital circuit.

In some embodiments, the at least one trigger combination block can have a plurality of inputs. In some of these embodiments, the at least one trigger combination block can include a multiplexer; at least one of the plurality of inputs can be coupled to an output of a match unit that processes the one or more signals produced by the digital circuit; and/or at least one of the plurality of inputs can be coupled to an output of a counter and comparator pair. In some embodiments, each counter in the counter and comparator pair can include at least one input that is coupled to an output of the state machine. In some embodiments, a state of the state machine can be controlled by a signal received on the input of the state machine.

In some embodiments, the state machine can have a plurality of states, each of the plurality of states being associated with a different set of trigger and capture signals. In some embodiments, each set of trigger and capture signals can define a manner in which the capture memory will capture and store the one or more signals produced by the digital circuit.

In another embodiment, a method for analyzing one or more signals produced by a digital circuit includes: receiving a plurality of input signals; selecting at least one of the plurality of input signals; performing a state transition in a state machine embedded in a memory of the digital circuit, in accordance with the at least one of the plurality of input signals; and outputting a set of trigger and capture signals associated with a state entered into as a result of the state transition.

In some embodiments, the plurality of input signals can include one or more of the following: at least one output signal from a match unit that processes the one or more signals produced by the digital circuit; at least one output signal from a counter and comparator pair; at least one equation defining a trigger condition; a hard zero signal and a hard one signal. In some embodiments, the set of trigger and capture signals can define a manner in which a capture memory will capture and store the one or more signals produced by the digital circuit. In some embodiments, the state machine can have a plurality of states, each of the plurality of states being associated with a different set of trigger and capture signals.

According to another embodiment, a non-transitory computer-readable storage medium has stored thereon a plurality of instructions, the plurality of instructions including instructions which, when executed by a processor, cause the processor to perform steps of a method for analyzing one or more signals produced by a digital circuit. The method steps can include: receiving a plurality of input signals; selecting at least one of the plurality of input signals; performing a state transition in a state machine embedded in a memory of the digital circuit, in accordance with the at least one of the plurality of input signals; and outputting a set of trigger and capture signals associated with a state entered into as a result of the state transition.

In some embodiments, the set of trigger and capture signals defines a manner in which a capture memory will capture and store the one or more signals produced by the digital circuit. In some embodiments, the state machine can have a plurality of states, each of the plurality of states being associated with a different set of trigger and capture signals.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION

Methods and apparatus for triggering and capturing digital circuit signals are described. The described embodiments combine both the trigger and capture functionalities of an integrated logic analyzer into a single memory-based state machine. That is, the state machine is embedded in the memory of the digital circuit. This approach enables the implementation of trigger and capture schemes that are either very simple or very complex without requiring any additional logic.

Figure 1:
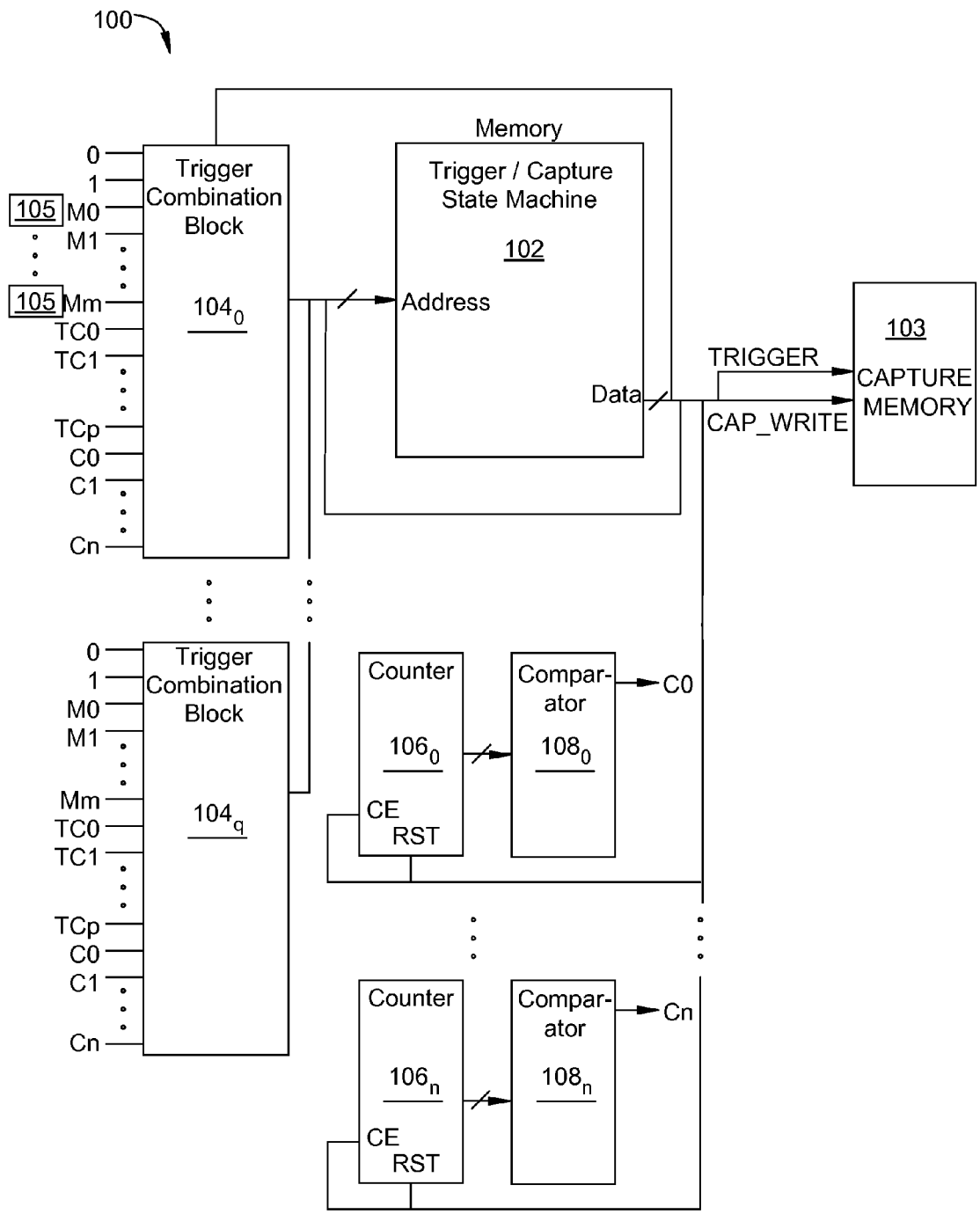
FIG. 1 is a schematic diagram illustrating one embodiment of an integrated logic analyzer.

FIG. 1 is a schematic diagram illustrating one embodiment of an integrated logic analyzer (ILA) 100. The ILA 100 may be integrated or embedded into the logic fabric of, for example, a digital circuit such as an integrated circuit. Such an integrated circuit could, in turn, comprise a programmable logic device (PLD), such as a field programmable gate array (FPGA), an application-specific integrated circuit (ASIC), or the like. As illustrated, the ILA 100 comprises a memory, namely, a state machine 102 deployed in the memory, coupled to a plurality of trigger combination blocks $104_0$-$104_q$ (hereinafter collectively referred to as "trigger combination blocks 104").

Each trigger combination block 104 comprises a computational element that is capable of combining data. As such, the trigger combination blocks 104 comprise multiplexers in one embodiment. The trigger combination blocks 104 each comprises a plurality of inputs and a single output. The plurality of inputs is configured to receive a plurality of input signals. Some of these input signals include match unit outputs M0-Mm. The match units (collectively shown as 105) associated with the match unit outputs M0-Mm are programmable comparators that look for a certain value or signature within a certain number of signals from the digital circuit. Each of the match unit outputs comprises a one-bit output (e.g., a "true" or "false" value) indicating whether the value or signature is found.

Others of the input signals include hard "0" and "1" signals. Still others of the input signals include existing trigger condition equations TC0-TCp. These trigger condition equations are arbitrary equations associated with one or more of the match units. In one embodiment, the input signals also optionally include comparator outputs C0-Cn, each of which comprises a "true" or "false" (e.g., high or low) value. Each type of input signal (i.e., match unit outputs M0-Mm, trigger condition equations TC0-TCp, and comparator outputs C0-Cn) may comprise any number of signals. These numbers may be the same, or may vary depending on the type of input signal. For instance, "m" might equal ten for the match unit outputs and "n" might equal five for the comparator outputs, and so on.

Each trigger combination block 104 is configured to select one of the input signals, under the control of an output signal from the state machine 102. The selected input signal is then provided, via the output of the trigger combination block 104, as an input signal to the state machine 102.

The state machine 102 implements the trigger and capture functionalities of the integrated logic analyzer 100. To this end, the state machine 102 comprises an input configured for receiving an output signal from one or more of the trigger combination blocks 104. This output signal or signals, in combination with one or more additional output signals from the state machine 102, controls an address in the state machine 102, where the address is equivalent to a state of the state machine 102. This state, in turn, is associated with a set of trigger and capture signals that define a particular trigger and capture scheme (i.e., broadly defines the manner in which a capture memory will capture and store one or more signals produced by the digital circuit as discussed below). The state machine 102 additionally comprises an output that outputs data comprising the trigger and capture signals (TRIGGER and CAP_WRITE). These and (optionally) other outputs of the state machine may be connected, for example, to the input of a capture memory 103, in which signals captured pursuant to the trigger and capture scheme are stored. The capture memory can be part of the memory employing the state machine 102 or a separate memory.

In one embodiment, the state machine 102 can be configured in an arbitrary "if, else if" structure, which is reconfigurable at runtime. In another embodiment, the state machine 102 can be implemented in the logic fabric of the digital circuit with cycle-to-cycle control over the capture memory (i.e., starting and stopping on different conditions).

The number of trigger combination blocks 104 that is used will determine the number of conditions upon which a state transition can be made by the state machine 102. In particular, the use of multiple trigger combination blocks 104 controlling multiple address lines of the state machine 102 will allow state transitions to be made based on multiple conditions.

In one embodiment, the integrated logic analyzer optionally comprises one or more counters $106_0$-$106_n$ (hereinafter collectively referred to as "counters 106"). Each counter 106 comprises a first input configured for receiving a clock enable (CE) signal and a second input configured for receiving a reset (RST) signal. Each counter 106 additionally comprises an output that is coupled to the input of a programmable comparator $108_0$-$108_n$ (hereinafter collectively referred to as "comparators 108"). Each comparator compares the multi-bit counter output to a predetermined value (e.g., a value programmed into the comparator) and provides a respective clock signal (i.e., comparator output signal) C0-Cn to the inputs of the trigger combination blocks 104, as discussed above. In particular, each clock signal C0-Cn is provided by a different counter 106/comparator 108 pair.

In one embodiment, additional outputs from the state machine 102 are received by the counters 106 over the first and/or second inputs. This allows the state machine 102 to control the counters 106 cycle-to-cycle (e.g., by resetting or stopping the counters 106). In one embodiment, the state machine outputs separate reset and control signals for each counter.

The integrated logic analyzer 100 is capable of implementing complex trigger and capture schemes without the assistance of additional logic. For example, the integrated logic analyzer 100 could implement a trigger and capture scheme such as: (1) Wait for (A==1); (2) Capture one sample; (3) Wait for (B==1); (4) Capture 10 samples; (5) Go to step (1) until the sample buffer is full. Such trigger and capture schemes cannot be implemented in conventional integrated logic analyzers unless custom combinatorial logic and software are added. Moreover, the introduction of a small amount of additional logic in the form of the counters 106 and comparators 108 dramatically increases the power of the integrated logic analyzer 100 by providing additional logic inputs that are capable of controlling the state of the state machine 102.

The integrated logic analyzer 100 also exhibits increased routability and performance relative to conventional integrated logic analyzers. Specifically, the use of only a memory element (state machine 102) with minimal companion logic greatly increases the routability (and, likely, the maximum frequency) of the integrated logic analyzer 100.

In addition, the integrated logic analyzer 100 is relatively easy to use. For example, memories are very easy to load data into. If dual-port memories are used, then data can be loaded into the memories at runtime while the rest of the digital circuit design is still running. In this case, one port of the memory would be used to load or read data, while the other port would be used to operate the state machine 102.

Figure 2:
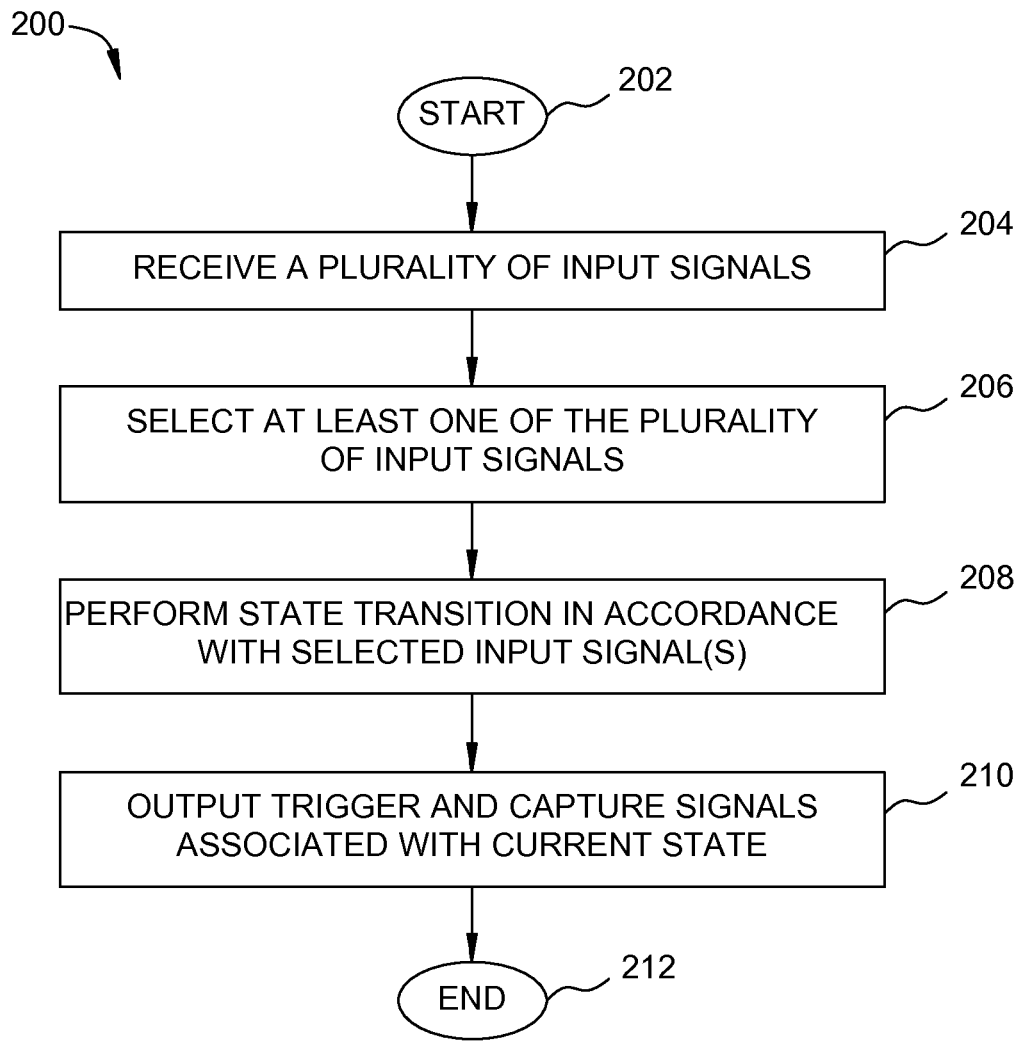
FIG. 2 is a flow diagram illustrating one embodiment of a method for triggering and capturing digital circuit signals.

FIG. 2 is a flow diagram illustrating one embodiment of a method 200 for triggering and capturing digital circuit signals. The method 200 may be implemented, for example, in the integrated logic analyzer 100 illustrated in FIG. 1. As such, reference is made in the discussion of the method 200 to various elements of the integrated logic analyzer 100. It will be appreciated, however, that the method 200 is not limited to implementation with the configuration illustrated in FIG. 1.

The method 200 is initialized in step 202 and proceeds to step 204, where the trigger configuration blocks 104 receive a plurality of input signals. As discussed above, the plurality of input signals may include one or more of: match unit outputs, counter outputs, existing trigger condition equations, or a hard "0" or "1" signal. In step 206, the trigger configuration blocks 104 select at least one of the input signals. For example, the trigger configuration blocks 104 may select one of the input signals that will affect the next state of the state machine 102.

In step 208, the state machine 102 performs a state transition in accordance with the selected input signal(s). Specifically, the state machine 102 transitions to the state associated with the address that is indicated by the selected input signal(s). It should be noted that although step 208 calls for performing a state transition, the state machine 102 may actually remain in its current state if the address indicated by the selected input signal(s) is the same as the current address.

In step 210, the state machine 102 outputs the trigger and capture signals (TRIGGER and CAP_WRITE) associated with the current (i.e., post-transition) state. In one embodiment, the trigger and capture signals are output to a capture memory 103. The capture memory may then implement the trigger and capture scheme defined by the trigger and capture signals to capture the signals of the digital circuit that are pertinent to the trigger and capture scheme. The method 200 terminates in step 212.

Figure 3:
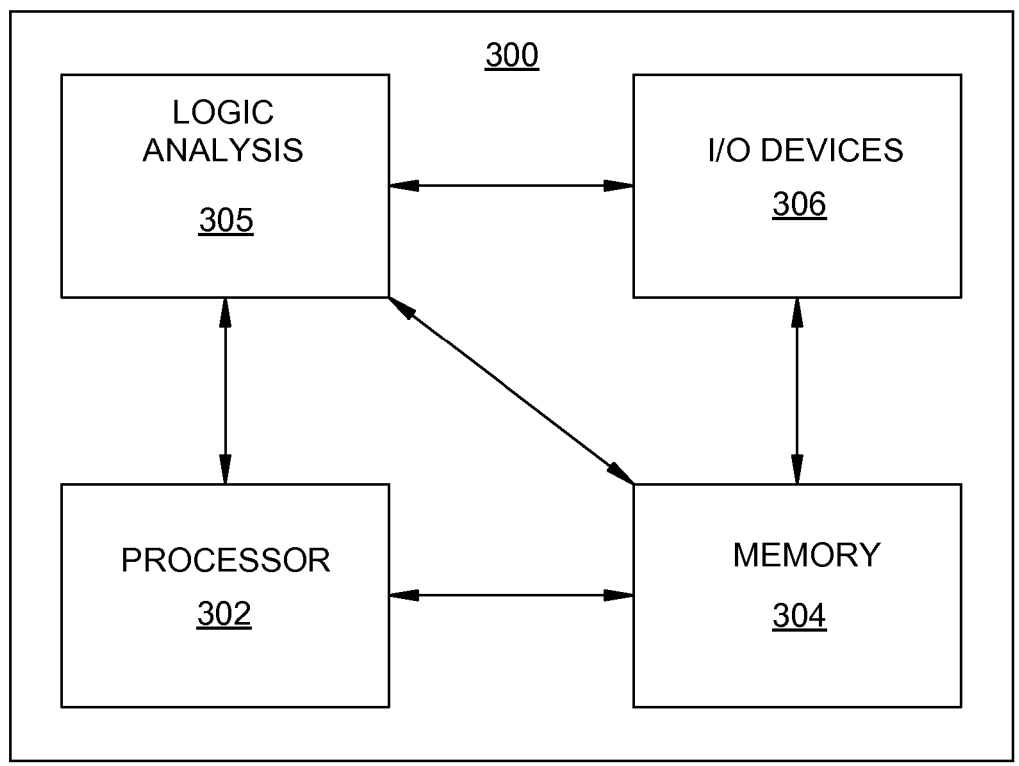
FIG. 3 depicts a high level block diagram of a general purpose computer or a computing device suitable for use in performing some or all of the functions described herein.

FIG. 3 depicts a high level block diagram of a general purpose computer or a computing device suitable for use in performing some or all of the functions described herein. The general purpose computer may incorporate, for example, a digital circuit including an integrated logic analyzer. As depicted in FIG. 3, the general purpose computer 300 comprises a processor element or processing elements 302 (e.g., a central processing unit (CPU)), a memory 304 (e.g., a random access memory (RAM) and/or a read only memory (ROM)), a logic analysis module 305 for triggering and capturing signals from a digital circuit, and various input/output devices 306 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

The described embodiments can be implemented in software and/or in a combination of software and hardware (e.g., using application specific integrated circuits (ASIC), a general purpose computer, one or more portions of a PLD, or any other hardware equivalents such as microprocessors). In one embodiment, one or more steps of the present module or process for triggering and capturing signals from a digital circuit may be loaded into memory 304 and executed by processor 302 to implement the functions as discussed above. As such, the present module or process 305 for triggering and capturing signals from a digital circuit can be stored on a non-transitory computer readable storage medium (e.g., RAM memory, magnetic or optical drive or diskette and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying figures that recite a determining operation or involve a decision do not necessarily require that both branches of the determining operation be practiced. In other words, one of the branches of the determining operation can be deemed as an optional step.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A logic analyzer for analyzing one or more signals produced by a digital circuit, comprising:
   at least one trigger combination block; and
   a state machine deployed in a memory coupled to the at least one trigger combination block, the state machine comprising:
   an input coupled to an output of the at least one trigger combination block; and
   an output coupled to a capture memory in which one or more signals produced by the digital circuit are stored pursuant to a set of trigger and capture signals produced by the state machine,
   wherein the set of trigger and capture signals defines when and how the capture memory will capture and store the one or more signals produced by the digital circuit.

2. The logic analyzer of claim 1, wherein the logic analyzer is integrated into the digital circuit.

3. The logic analyzer of claim 1, wherein the at least one trigger combination block comprises a plurality of inputs.

4. The logic analyzer of claim 3, wherein the at least one trigger combination block is a multiplexer.

5. The logic analyzer of claim 3, wherein at least one of the plurality of inputs is coupled to an output of a match unit that processes the one or more signals produced by the digital circuit.

6. The logic analyzer of claim 3, wherein at least one of the plurality of inputs is coupled to an output of a counter and comparator pair.

7. The logic analyzer of claim 6, wherein each counter in the counter and comparator pair comprises at least one input that is coupled to an output of the state machine.

8. The logic analyzer of claim 3, wherein a state of the state machine is controlled by a signal received on the input of the state machine.

9. The logic analyzer of claim 1, wherein the state machine comprises a plurality of states, each of the plurality of states being associated with a different set of trigger and capture signals.

10. The logic analyzer of claim 1, wherein the set of trigger and capture signals fully defines when and how the capture memory will capture and store the one or more signals produced by the digital circuit, without requiring further processing of the set of trigger and capture signals.

11. A method for analyzing one or more signals produced by a digital circuit, the method comprising:
    receiving a plurality of input signals;
    selecting at least one of the plurality of input signals;

performing a state transition in a state machine embedded in a memory of the digital circuit, in accordance with the at least one of the plurality of input signals; and outputting by the state machine a set of trigger and capture signals associated with a state entered into as a result of the state transition, wherein the set of trigger and capture signals defines when and how a capture memory will capture and store the one or more signals produced by the digital circuit.

12. The method of claim 11, wherein the plurality of input signals comprises at least one output signal from a match unit that processes the one or more signals produced by the digital circuit.

13. The method of claim 11, wherein the plurality of input signals comprises at least one output signal from a counter and comparator pair.

14. The method of claim 11, wherein the plurality of input signals comprises at least one equation defining a trigger condition.

15. The method of claim 11, wherein the plurality of input signals comprises a hard zero signal and a hard one signal.

16. The method of claim 11, wherein the state machine comprises a plurality of states, each of the plurality of states being associated with a different set of trigger and capture signals.

17. The method of claim 11, wherein the set of trigger and capture signals fully defines when and how the capture memory will capture and store the one or more signals produced by the digital circuit, without requiring further processing of the set of trigger and capture signals.

18. A non-transitory computer-readable storage medium having stored thereon a plurality of instructions, the plurality of instructions including instructions which, when executed by a processor, cause the processor to perform steps of a method for analyzing one or more signals produced by a digital circuit, comprising:

receiving a plurality of input signals;

selecting at least one of the plurality of input signals;

performing a state transition in a state machine embedded in a memory of the digital circuit, in accordance with the at least one of the plurality of input signals; and outputting by the state machine a set of trigger and capture signals associated with a state entered into as a result of the state transition, wherein the set of trigger and capture signals defines when and how a capture memory will capture and store the one or more signals produced by the digital circuit.

19. The non-transitory computer-readable storage medium of claim 18, wherein the state machine comprises a plurality of states, each of the plurality of states being associated with a different set of trigger and capture signals.

20. The non-transitory computer-readable storage medium of claim 18, wherein the set of trigger and capture signals fully defines when and how the capture memory will capture and store the one or more signals produced by the digital circuit, without requiring further processing of the set of trigger and capture signals.

* * * * *